(12) United States Patent
Nashiki et al.

(10) Patent No.: US 9,243,320 B2
(45) Date of Patent: Jan. 26, 2016

(54) METHOD FOR DOUBLE-SIDE VACUUM FILM FORMATION AND LAMINATE OBTAINABLE BY THE METHOD

(75) Inventors: Tomotake Nashiki, Osaka (JP); Yoshimasa Sakata, Osaka (JP); Hideo Sugawara, Osaka (JP); Kenkichi Yagura, Osaka (JP); Akira Hamada, Osaka (JP); Yoshihisa Ito, Osaka (JP); Kuniaki Ishibashi, Osaka (JP)

(73) Assignee: NITTO DENKO CORPORATION, Ibaraki-Shi, Osaka (JP)

(*) Notice: Subject to any disclaimer, the term of this patent is extended or adjusted under 35 U.S.C. 154(b) by 643 days.

(21) Appl. No.: 13/559,155

(22) Filed: Jul. 26, 2012

(65) Prior Publication Data
US 2013/0029163 A1    Jan. 31, 2013

(30) Foreign Application Priority Data

Jul. 29, 2011 (JP) ................................. 2011-166670
Jul. 12, 2012 (JP) ................................. 2012-156281

(51) Int. Cl.
*C23C 14/56* (2006.01)

(52) U.S. Cl.
CPC ....... *C23C 14/562* (2013.01); *Y10T 428/31678* (2015.04)

(58) Field of Classification Search
CPC .................................................. C23C 14/562
See application file for complete search history.

(56) References Cited

U.S. PATENT DOCUMENTS

| 3,933,644 A * | 1/1976 | Skinner et al. ........... 204/298.12 |
| 5,447,748 A | 9/1995 | Kitaori et al. |
| 2010/0140078 A1 * | 6/2010 | Pinarbasi et al. .......... 204/192.1 |
| 2010/0242842 A1 | 9/2010 | Takeuchi et al. |
| 2010/0261008 A1 * | 10/2010 | Kikuchi ....................... 428/332 |
| 2011/0143019 A1 | 6/2011 | Mosso et al. |
| 2011/0171395 A1 * | 7/2011 | Juliano et al. ................. 427/455 |
| 2012/0276397 A1 | 11/2012 | Nashiki et al. |

(Continued)

FOREIGN PATENT DOCUMENTS

| CN | 101908582 A | 12/2010 |
| CN | 102899629 A | 1/2013 |
| CN | 102899630 A | 1/2013 |

(Continued)

OTHER PUBLICATIONS

European Office Action for 12178229.0 dated Nov. 13, 2012.

(Continued)

*Primary Examiner* — Keith Hendricks
*Assistant Examiner* — Timon Wanga
(74) *Attorney, Agent, or Firm* — Hauptman Ham, LLP

(57) ABSTRACT

The film formation method comprises the steps of: unrolling and feeding an elongated substrate wound in a roll form from a first roll chamber in a first direction from the first roll chamber toward a second roll chamber; degassing the fed substrate; forming a first material film on a first surface in a first film formation chamber; guiding the substrate having the first material film formed thereon to a second film formation chamber in a second direction from the second roll chamber toward the first roll chamber; forming, in the second film formation chamber, a second material film on a second surface opposite the first surface of the substrate when it is being guided in the second direction; taking up, in a third roll chamber provided between the first roll chamber and the second roll chamber, the substrate in a roll state.

14 Claims, 3 Drawing Sheets

(56) References Cited

U.S. PATENT DOCUMENTS

| | | |
|---|---|---|
| 2013/0029161 A1 | 1/2013 | Nashiki et al. |
| 2013/0029162 A1 | 1/2013 | Nashiki et al. |

FOREIGN PATENT DOCUMENTS

| | | |
|---|---|---|
| EP | 0428358 | 5/1991 |
| EP | 1988186 A1 | 11/2008 |
| EP | 2518761 | 10/2012 |
| JP | 7-98854 | 4/1995 |
| JP | 4415584 | 2/2010 |
| JP | 2010053447 A | 3/2010 |
| JP | 2010236076 | 10/2010 |
| WO | 0176768 A1 | 10/2001 |
| WO | 2011/049567 | 4/2011 |

OTHER PUBLICATIONS

Chinese Office Action for application No. 201210266812.1 dated Jun. 16, 2015.

European Office Action for application No. 12178229.6 dated Sep. 17, 2015.

* cited by examiner

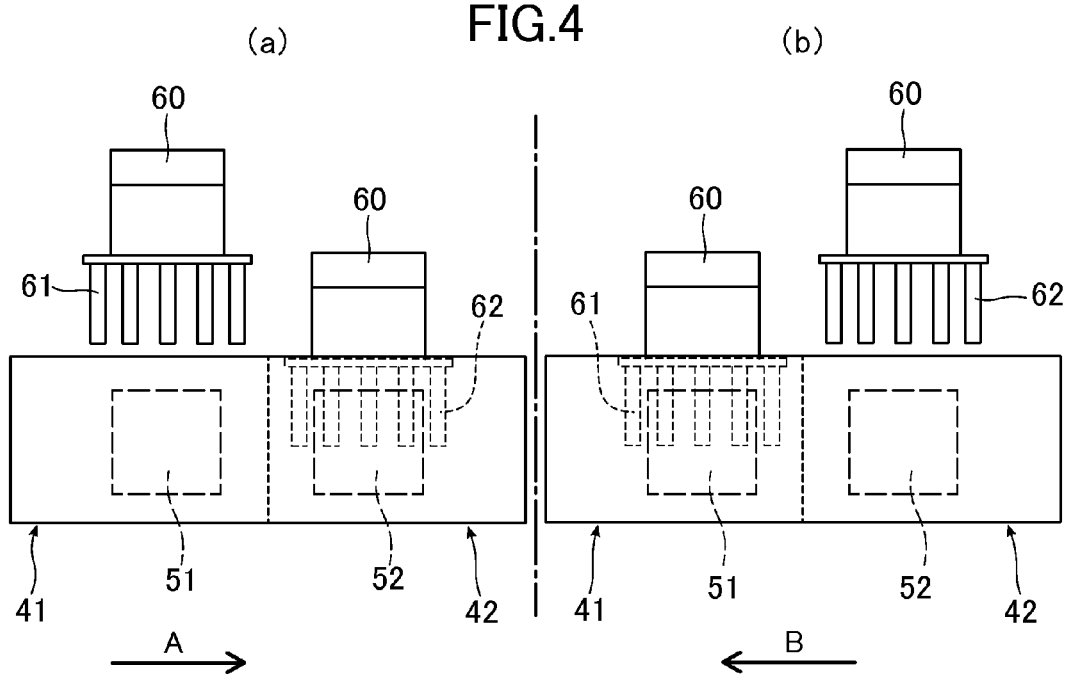

METHOD FOR DOUBLE-SIDE VACUUM FILM FORMATION AND LAMINATE OBTAINABLE BY THE METHOD

CROSS REFERENCE TO RELATED APPLICATION

This application claims the priority of Japanese Patent Application No. 2011-166670 filed on Jul. 29, 2011, and Japanese Patent Application No. 2012-156281 filed on Jul. 12, 2012 in the JPO (Japan Patent Office), the disclosure of which is incorporated herein in their entirety by reference.

TECHNICAL FIELD

The present invention relates to a method for film formation, and in particular to a method for double-side vacuum film formation capable of subjecting an elongated substrate to vacuum film formation, and a laminate obtainable by the method.

BACKGROUND ART

Various film formation processes, such as a vacuum vapor deposition process, a sputtering process and an ion plating process, have been developed. A laminate obtained by such a film formation process is widely utilized in production of display devices, such as liquid crystal displays or organic LE (Light Emitting) displays, semiconductor devices, etc. In the display devices, the semiconductor devices, etc., the laminate is usable as a protective film, and various types of functional films, such as an optical filter and an anti-reflection film.

Late years, demand for device units using the functional films, such as a LCD (Liquid Crystal Display) TV, a mobile phone and a video game machine, has been rapidly expanded. Along with expansion of the demand, it has become an urgent matter to develop a technique for mass-producing a functional film within a short period of time. In order to respond to this need, a roll-to-roll technique has been developed. The roll-to-roll technique is designed to unroll and feed an elongated substrate wound in a roll form, between two rolls, so as to enable continuous film formation, thereby increasing efficiency of a film formation operation.

One example of a film formation method using a roll-to-roll technique is disclosed in JP 4415584B (Patent Document 1). In this film formation method, one rotary drum is provided between two rolls, and a plurality of targets are arranged with respect to the one rotary drum which is transporting a substrate, to enable continuous film formation, thereby increasing efficiency of the film formation operation.

JP 2010-236076A (Patent Document 2) and JP 07-098854A (Patent Document 3) disclose a film formation method capable of subjecting particularly both sides of a substrate to film formation, using the roll-to-roll technique. In this film formation method, with a view to enabling double-side film formation, two rotary drums and one take-up roll disposed between the rotary drums are used, wherein a substrate fed from a feed roll is subjected to film formation through the two rotary drums which are rotating in respective opposite directions, and then rolled up on the take-up roll.

LIST OF PRIOR ART DOCUMENTS

Patent Documents

Patent Document 1: JP 4415584B
Patent Document 2: JP 2010-236076A
Patent Document 3: JP 07-098854A

SUMMARY OF THE INVENTION

Problem to be Solved by the Invention

A layer structure required for the functional film may vary from device to device to which these functional films are applied, and it may also vary depending on performance required for the functional film. For this reason, it is desired to develop a film formation method capable of producing, for example, a layer structure subjected to vacuum film formation on its both sides in an efficient and low-cost manner using a simple configuration of apparatus.

However, the techniques disclosed in the documents such as the Patent Documents 2 and 3 are capable of forming a film on both sides of a substrate, but do not make it clear in what manner various treatments such as degassing, annealing and film formation are specifically applied in performing the double-side film formation, and do not have a configuration that can flexibly apply these treatments depending on a wide variety of laminate structures. For this reason, these techniques are likely to fail to sufficiently perform heating after completion of film formation, causing a problem that a material of the formed film is fail to be fully crystallized.

Further, in these conventional apparatuses, a target is fixed at a position spaced apart by a predetermined distance with respect to a rotary drum. Thus, in order to perform maintenance on the target etc. supported by a cathode electrode, it is necessary to stop the film formation operation. This causes a problem of deterioration in efficiency of the film formation operation etc.

The present invention has been made to solve the above problems in the conventional techniques, and an object thereof is to provide a film formation method, under the roll-to-roll technique, promoting, in particular, optimization of double-side vacuum film formation and capable of producing a laminate subjected to vacuum film formation on its both sides in an efficient and low-cost manner, by appropriately applying treatments such as heating treatment in a suitable position using a simple configuration of apparatus.

In addition, it is also an object of the present invention to provide a film formation method capable of increasing efficiency of a film formation operation by allowing a cathode electrode requiring maintenance to be removed from a film formation chamber while continuing the required film formation operation.

Means for Solving the Problem

In order to accomplish the above object, according to an aspect of the present invention, there is provided a method for continuously subjecting an elongated substrate to vacuum film formation. The method comprises the steps of: a) unrolling and feeding an elongated substrate wound in a roll form from a first roll chamber in a first direction from the first roll chamber toward a second roll chamber; b) degassing the substrate fed in the first direction; c) forming, in a first film formation chamber, a first material film on the first surface of the degassed substrate; d) guiding the substrate having the first material film formed thereon to a second film formation chamber in a second direction from the second roll chamber toward the first roll chamber, and forming, in the second film formation chamber, a second material film on a second surface opposite the first surface of the substrate when it is being guided in the second direction; e) taking up, in a third roll chamber provided between the first roll chamber and the second roll chamber, the substrate in a roll state, the substrate having the first material film formed on the first surface and the second material film formed on the second surface; f) unrolling and feeding the substrate taken up in the third roll chamber from the first roll chamber in the first direction; g) guiding the fed substrate to the first film formation chamber in the first direction, and forming, in the first film formation chamber, a third material film on the first or the second surface of the substrate when it is being guided in the first direction; h) guiding the substrate having the third material film formed thereon to the second film formation chamber in the second direction, and forming, in the second film formation chamber, a fourth material film on the second or the first surface of the substrate when it is being guided in the second direction; and i) taking up, in the third roll chamber, the substrate in a roll state, the substrate having the third or fourth material film laminated on the first material film on the first surface and the fourth or third material film laminated on the second material film on the second surface. According to this aspect of the present invention, a laminate comprising the first material film and the third or fourth material film laminated in this order on the first surface, and the second material film and the fourth or third material film laminated in this order on the second surface of the substrate is obtained in one apparatus. Each of the first and the second material films may be a transparent electrode, and the third and the fourth material films may be a metal such as copper, copper alloy, silver or silver alloy.

In the above method, the substrate may be subjected to an annealing treatment, the substrate having the first material film formed on the first surface and the second material film formed on the second surface. This makes it possible to strengthen the effect of annealing treatment.

Further, in the above method, after taking up the substrate in the third roll chamber, the substrate having the first material film formed on the first surface and the second material film formed on the second surface, the substrate may be removed in the third chamber in a state where a part of the substrate is communicated with a load lock mechanism provided between the third roll chamber and an adjacent chamber to the third roll chamber while shielding between the third roll chamber and the adjacent chamber using the load lock mechanism. This makes it possible to keep all the chambers other than the third roll chamber in a vacuum state during the above operation.

Further, in the above method, when unrolling and feeding the substrate taken up in the third roll chamber from the first roll chamber in the first direction, the substrate may be set in the first roll chamber in a state where a part of the substrate is communicated with a load lock mechanism provided between the first roll chamber and an adjacent chamber to the first roll chamber while shielding between the first roll chamber and the adjacent chamber using the load lock mechanism. This makes it possible to keep all the chambers other than the first roll chamber in a vacuum state during the above operation.

In the above method, the method may have a configuration comprising, instead of the steps c) to e), the steps of: c') guiding the degassed substrate to a second film formation chamber in the first direction, and forming, in the second film formation chamber, a second material film on the first surface of the substrate when it is being guided in the first direction; d') taking up, in the second roll chamber, the substrate in a roll state, the substrate having the second material film formed thereon; e') unrolling and feeding the substrate taken up in the second roll chamber from the second roll chamber in a second direction from the second roll chamber toward the first roll chamber; f') forming, in a third film formation chamber, a first material film on the second material film formed on the first surface of the substrate fed in the second direction; and g') taking up, in the first roll chamber, the substrate in a roll state, the substrate having the third material film laminated on the second material film. According to this aspect of the present invention, the second material film can be formed in the course of a first path for feeding the substrate from the first roll chamber to the second roll chamber, and the third material film can be formed in the course of a second path for feeding the substrate from the second roll chamber to the first roll chamber, using the above apparatus. Thus, the substrate can be fed back and forth between the first roll chamber and the second roll chamber to continuously produce a laminate comprising the second material film and the third material film laminated on the substrate in this order, in a roll-to-roll manner.

Further, in the above method, when forming, in the second film formation chamber, the second material film on the first surface of the substrate fed in the first direction, a first cathode electrode of the first film formation chamber supporting a target of the first material film may be removed from the first film formation chamber. According to this aspect of the present invention, in the first film formation chamber, maintenance on the target of the third material can be performed, while continuously performing a film formation operation in the second film formation chamber, so that it becomes possible to increase production efficiency.

Similarly, forming, in the first film formation chamber, when forming, in the first film formation chamber, the third material film on the first surface of the substrate fed in the second direction, a second cathode electrode of the second film formation chamber supporting a target of the second material film may be removed from the second film formation chamber. According to this aspect of the present invention, in the second film formation chamber, maintenance on the target of the second material can be performed, while continuously performing a film formation operation in the first film formation chamber, so that it becomes possible to increase production efficiency.

In the above method, the substrate may be subjected to a plasma treatment in a period after it is fed from the first roll chamber and before the first material film is formed thereon. This makes it possible to strengthen the effect of the plasma treatment.

In the above method, the substrate may be degassed in a heating chamber in a period after it is fed from the first roll chamber and before the first material film is formed thereon, or the substrate may be degassed when it is being guided in the first direction, in a period after the substrate is fed from the first roll chamber and before the first material film is formed thereon. This makes it possible to strengthen the effect of the degassing.

In the above method, the substrate may be subjected to an annealing treatment in a period after the first material film is formed on the first surface and the second material film is formed on the second surface of thereof and before the third material film and the fourth material film are formed thereon. Further, the substrate may be subjected to an annealing treatment, the substrate having the first material film and the third or fourth material film laminated in this order on the first surface, and having the second material film and the fourth or third material film laminated in this order on the second surface thereof. This makes it possible to strengthen the effect of annealing treatment.

Effect of the Invention

The present invention makes it possible to provide a film formation method capable of producing a laminate subjected to vacuum film formation on its both sides in an efficient and low-cost manner using a simple apparatus configuration.

BRIEF DESCRIPTION OF THE DRAWINGS

FIG. 4 is a schematic diagram illustrating an arrangement of a cathode electrode achievable by the film formation method according to the present invention.

DESCRIPTION OF EMBODIMENTS

With reference to the accompanying drawings, a preferred embodiment of the present invention will now be described.

Figure 1:
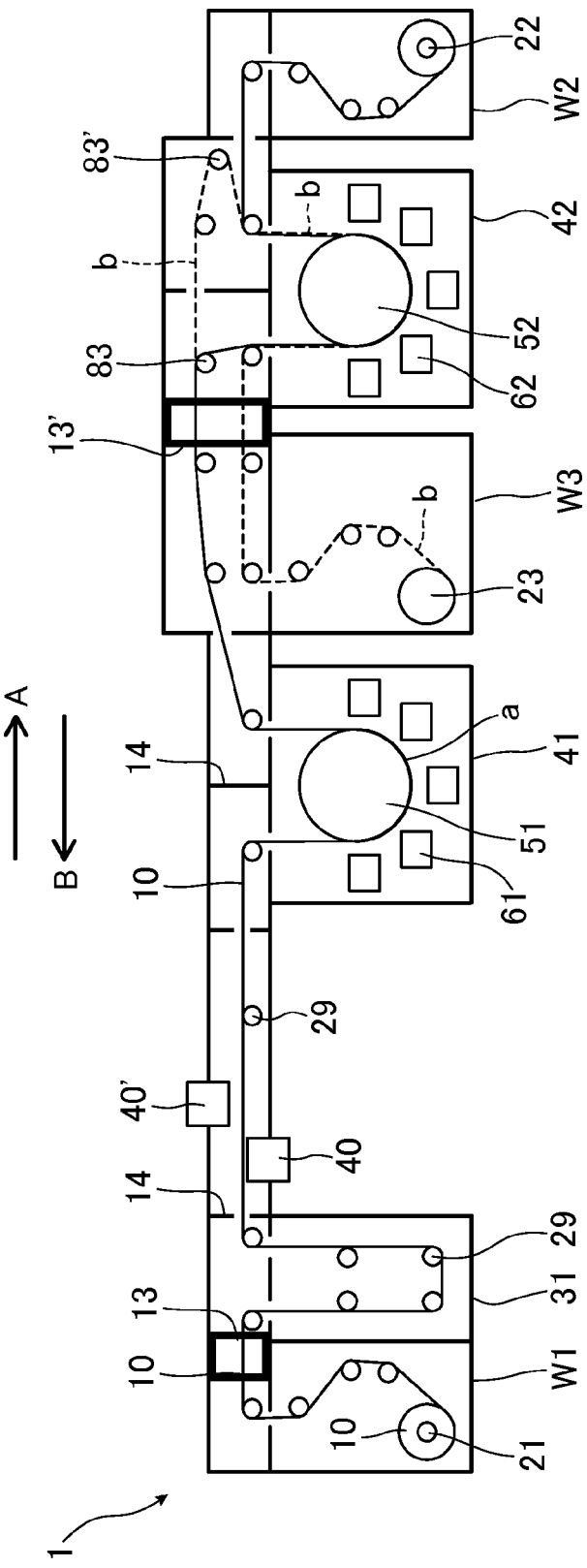
FIG. 1 is a schematic diagram illustrating one example of a film formation apparatus capable of implementing a film formation method according to the present invention.

FIG. 1 illustrates one example of a film formation apparatus 1 capable of implementing the present film formation method. For example, the film formation apparatus 1 comprises: a first roll chamber W1, a second roll chamber W2 and a third roll chamber W3 each capable of housing an elongated substrate 10 wound in a roll form, a first film formation chamber 41 provided between the first roll chamber W1 and the third chamber W3, a second film formation chamber 42 provided between the third roll chamber W3 and the second roll chamber W2, a first heat chamber 31 provided between the first roll chamber W1 and the first film formation chamber 41, plasma treatment devices 40, 40' provided between the first heat chamber 31 and the first film formation chamber 41, and switching rolls 83, 83' for changing paths for the substrate 10. To simply present the apparatus configuration, these elements may be positioned in a nearly linear fashion as illustrated. Further, it is only necessary for this apparatus to include the elements capable of implementing the present film formation method, but other elements may also be included.

For convenience, a feed path to which switching is performed by the switching roll 83' is herein referred to as "first feed path", while a feed path to which switching is performed by the switching roll 83 is referred to as "second feed path". As shown in FIG. 1, in a period after a substrate 10 is unrolled and fed in a first direction A from the first roll chamber W1 toward the second roll chamber W2 through until it reaches at least the switching roll 83, the substrate 10 moves along the common part regardless of the above feed paths. However, after reaching the switching roll 83, in the first feed path, the substrate 10 is turned around by the switching roll 83' and thereby fed to pass through the second film formation chamber 42 in the second direction B, as indicated by the broken line, whereas, in the second feed path, the substrate 10 is fed to pass through the second film formation chamber 42 in the first direction A, as indicated by the solid line.

The film formation apparatus 1 in FIG. 1 is adaptable to any process such as a vacuum vapor deposition process, a sputtering process, and a chemical vapor deposition (CVD) process. Among them, the sputtering process is capable of achieving large-area uniform deposition and forming a dense thin film, with high continuous productivity and excellent production stability. In the sputtering process, particularly, DC Magnetron Sputtering is capable of forming a magnetic field on a surface of a target to confine electrons near the target so as to suppress damage to a substrate. These treatments are performed with keeping each chamber in a vacuum state.

In order to effectively maintain a vacuum state, a partition 14 is provided between adjacent ones of the chambers of the film formation apparatus 1. Each of the partitions 14 is provided with a slit 13 for allowing the substrate 10 to pass therethrough. Further, in order to effectively maintain the vacuum state of the chambers other than operating space, load lock mechanisms 13, 13' may be provided. The load lock mechanism has been well known, and thus the description thereof will be omitted here.

The substrate 10 to be used in this method may be made of a material allowing a film to be formed thereon, such as one of a wide variety of resin films including a PET film, or one of a wide variety of metal films including an aluminum sheet, and the material is not particularly limited. However, the substrate 10 is formed as a member having a generally elongated shape, and flexibility enough to be wound into a roll form. During film formation, the substrate 10 is fed using an array of guide rollers 29 and others, in a roll-to-roll manner, i.e., between the first roll chamber W1 through the third roll chamber W3, in a first direction A from the first roll chamber W1 toward the second roll chamber W2, or in a second direction B from the second roll chamber W2 toward the first roll chamber W1.

In order to wind the substrate 10 into a roll form, a first feed/take-up roll 21, and a second feed/take-up roll 22 are provided in the first roll chamber W1 and the second roll chamber W2, respectively. When the substrate 10 is fed in the first direction A, the first feed/take-up roll 21 performs an unrolling (feed-out) operation, and the second feed/take-up roll 22 performs a rolling-up (take-up) operation. On the other hand, when the substrate 10 is fed in the second direction B, the second feed/take-up roll 22 performs an unrolling (feed-out) operation, and the first feed/take-up roll 21 performs a rolling-up (take-up) operation.

In the heat chamber 31, the substrate 10 is heated and subjected to treatments such as degassing treatment and annealing treatment. The obtainable effect varies depending on its installation position and a usage mode of the film formation apparatus 1. For example, the heating chamber 31 provided between the first roll chamber W1 and the first film formation chamber 41 can heat and degas the substrate 10 before film formation in the first film formation chamber 41. During a vacuum process or the like, water is likely to come up to a surface from an inside of the substrate 10. In this case, such water has a great impact on a composition of a film to be formed. In the film formation apparatus 1, the heating chamber 31 provided at the above position may remove water to reduce the negative impact.

In addition, the a heating chamber (not shown) provided between the second film formation chamber 42 and the second roll chamber W2 makes it possible to heat the substrate 10 after subjecting the substrate 10 to film formation in the second film formation chamber 42, thereby annealing a material of a film formed on the substrate 10 to change the atomic arrangement of the film such that crystal grains are regularly arranged. Alternatively or additionally, a heating chamber may be provided, for example, between the first film formation chamber 41 and the second film formation chamber 42, according to need. However, a heating function provided by a rotary drum in the film formation chamber may be utilized to obtain the same effect without providing the heating chamber.

The plasma treatment devices 40, 40' are used to subject the substrate 10 to a plasma treatment. The plasma treatment allows a surface of the substrate 10 to be activated and cleaned, thereby allowing the subsequent film formation to be more effectively performed. As with the heating chamber, an installation position of the plasma treatment device is not particularly limited. For example, utilization of the plasma treatment devices 40, 40' provided between the heating chamber 31 and the first film formation chamber 41 makes it possible to subject the substrate 10 to the plasma treatment before film formation in the first film formation chamber 41. Alternatively or additionally, a plasma treatment device may be provided, for example, between the first film formation chamber 41 and the second film formation chamber 42, according to need. However, the plasma treatment device is not necessarily required.

It is only necessary to provide at least two film formation chambers. However, an additional film formation chamber may be provided. An installation position of the additional film formation chamber is not particularly limited as long as it is located between the first roll chamber W1 and the second roll chamber W2. For example, the additional film formation chamber may be provided between the heating chamber 31 and the first film formation chamber 41. A material of a film to be formed in each of the film forming chambers is not particularly limited. For example, it may be a metal such as copper, copper alloy, silver or silver alloy, or a transparent conducting layer. The silver alloy may be a so-called APC (Ag—Pd—Cu) alloy prepared by adding palladium (Pd) and copper (Cu) to silver (Ag). In this case, silver may be contained in an amount of 90 atomic % as a primary component of the APC alloy.

The first film formation chamber 41 comprises a first rotary drum 51 and a first cathode electrode 61. The first rotary drum 51 is adapted to be bi-directionally rotatable to feed the substrate 10 in a selected one of the first direction A and the second direction B, so that the substrate 10 is fed in the selected one of the first direction A and the second direction B via a periphery of the first rotary drum 51. The first rotary drum 51 may have a function of heating the substrate 10. An effect to be obtained by the heating function of the first rotary drum 10 may be considered to be equal to that of the heating chamber. Therefore, the first rotary drum 51 may be used as a substitute for the heating function of the heating chamber. Conversely, the heating function of the heating chamber may be substituted for the heating function of the first rotary drum 51.

The first cathode electrode 61 consists of a plurality of electrode elements provided with respect to the first rotary drum 51. More specifically, each of the electrode elements of the first cathode electrode 61 is adapted to be movably disposed in opposed relation to the first rotary drum 51, while supporting a target for forming a film of a predetermined material. The predetermined material to be formed as a film may be freely selected depending on a usage mode of the film formation apparatus 1. For example, when the substrate 10 is passed around the first rotary drum 51 in the first direction A, the predetermined material may be set to a first material or a third material. The material may be freely changed depending on the usage mode of the film formation apparatus 1. During a period of time in which the substrate 10 is passed around the first rotary drum 51, a film of the predetermined material such as the first or third material will be formed on the substrate 10 using the first cathode electrode 61.

The second film formation chamber 42 has the same or similar configuration and functions as/to those of the first film formation chamber 41, and comprises a second rotary drum 52 and a second cathode electrode 62. The second rotary drum 52 is adapted to continuously feed the substrate 10 in a selected one of the first direction A and the second direction B via a periphery thereof, while heating the substrate 10. The second cathode electrode 62 consists of a plurality of electrode elements adapted to be disposed around and in opposed relation to the second rotary drum 52. The material in the second cathode electrode 62 may also be freely selected as the first cathode electrode 61. For example, a predetermined material of a target to be supported by the second cathode electrode 62 may be set to a second material when the substrate 10 is passed around the second rotary drum 52 in the first direction, and may be set to a fourth material when the substrate 10 is passed around the second rotary drum 52 in the second direction. The second material and the fourth material may be freely changed depending on the usage mode of the film formation apparatus 1. During a period of time in which the substrate 10 is passed around the second rotary drum 52, a film of the predetermined material will be formed on the substrate 10 using the second cathode electrode 62.

The heating in each of the first and second rotary drums 51, 52 and the film formation are mutually independent functions. Thus, for example, the film formation apparatus 1 can be controlled such that the first film formation chamber 41 performs only the heating, and the second film formation chamber 42 performs only the film formation. With a view to allowing the heating to be sufficiently performed, each of the first and second rotary drums 51, 52 may be configured to have a relatively large diameter and thereby increase a feeding time with respect to the substrate 10.

Figure 2:
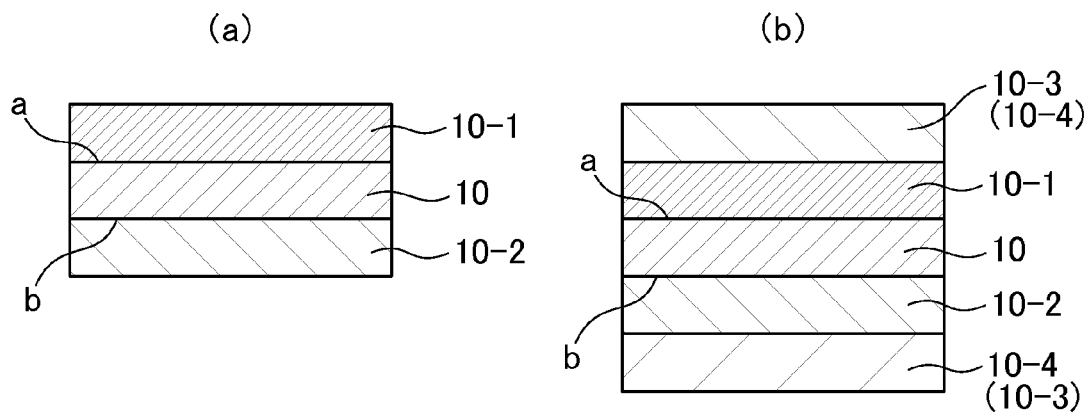
FIG. 2 is a schematic diagram illustrating an example structure of a laminate obtained by one usage mode of the film formation method according to the present invention.

With reference also to FIG. 2, one usage mode of this film formation method using a first feed path of a film formation apparatus 1, namely a feed path defined by a switching roll 83' will be described. FIG. 2 illustrates an example structure of a laminate obtained by this usage mode.

In this usage mode, nearly the same treatments are repeated at least twice. For convenience, each of these treatments will be referred to as a first treatment and a second treatment.

In the first treatment, firstly, the substrate 10 is unrolled and fed from the first roll chamber W1 in the first direction A using one surface a (referred to as "first surface", for convenience) as a surface for film formation. The fed substrate 10 is degassed using a heating function of the heating chamber 31. Subsequently, a first material film 10-1 is formed on the first surface a of the substrate 10 that has been degassed in the heat chamber 31, using the first cathode electrodes 61 of the first film formation camber 41. The substrate 10 is then guided to the second film formation camber 42 in the second direction B by the switching roll 83'. A second material film 10-2 is formed on a second surface b opposite the first surface a of the substrate 10 when it is being guided in the second direction B, using the second cathode electrodes 62 of the second film formation camber 42. The substrate 10 is then once rolled op in the third roll chamber W3. As a result, the laminate shown in FIG. 2(a), namely a laminate comprising the first material film 10-1 and the second material film 10-2 respectively formed on the first surface a and the second surface b of the substrate 10 is obtained.

In the subsequent second treatment, the same treatment as the first treatment is repeated. However, before starting the treatment, it is required to transfer the substrate 10 from the third roll chamber W3 to the first roll chamber W1. For this reason, firstly, the substrate 10 is removed from the third roll chamber W3. This operation is performed in a state where a part of the substrate 10 is communicated with a load lock mechanism 13' provided between the third roll chamber W3 and the second film formation chamber 42 adjacent to the third roll chamber W3 while shielding between the third roll chamber W3 and the second film formation chamber 42 by the load lock mechanism. This makes it possible to maintain all the chambers other than the third roll chamber W3 in a vacuum state during the above operation, and eliminate the need to bring the entire film formation apparatus 1 again in a vacuum state after the operation, reducing the hours of operation and enhancing efficiency of the film formation operation. Subsequently, the substrate 10 is set in the first roll chamber W1. As with the removing operation, this setting operation is also performed in a state where a part of the substrate 10 is communicated with a load lock mechanism 13 provided between the first roll chamber W1 and an adjacent chamber to the first roll chamber, such as the heating chamber 31 while shielding between the first roll chamber W1 and the heating chamber 31 by the load lock mechanism 13. Thus, it possible to maintain all the chambers other than the first roll chamber W1 in a vacuum state. When the substrate 10 is set in the first roll chamber W1, a user can freely determine which surface should be used as a surface for film formation by taking into consideration the structure of the laminate to be finally obtained. For convenience, description will be made here on the assumption that the substrate 10 is set to allow the first surface a to be the surface for film formation.

After setting the substrate 10 in the first roll chamber W1, it is fed from the first roll chamber W1 in the first direction A and degassed using a heating function of the heat chamber 31. Subsequently, a third material film 10-3 is formed on the first surface a of the substrate 10 degassed in the heat chamber 31, using the first cathode electrode 61 of the first film formation camber 41. The substrate 10 having the third material film 10-3 formed thereon is then guided to the second film formation camber 42 in the second direction B, using the switching roll 83', and a fourth material film 10-4 is formed on the second surface b of the substrate 10 when it is being guided, using the second cathode electrode 62 in the second film formation camber 42. Finally, the substrate 10 is rolled up in the third roll chamber W3.

From the above processes, the laminate shown in FIG. 2(*b*), namely a laminate comprising the first material film 10-1 and the third material film 10-3 laminated in this order on the first surface a, and the second material film 10-2 and the fourth material film 10-4 laminated in this order on the second surface b of the substrate 10 is obtained. These materials are not particularly limited. For example, the first material film and the second material film 10-1 may be made of a transparent conducting layer, such as ITO, and the second material film 10-2 and the fourth material film may be made of a metal, such as copper (Cu), copper alloy, silver (Ag) or silver alloy (e.g., APC alloy). In the case where the third material film 10-3 and the fourth material film 10-4 applied on the first material film 10-1 and the second material film 10-2 is made of a metal, this metallic material would block the heating of the ITO constituting the first material film 10-1 and the second material film 10-2. Therefore, particularly in this case, it is preferable to subject the substrate 10 to a heating treatment in the heat chamber 31, in other words, to an annealing treatment in a period after the first material film 10-1 and the second material film 10-2 are formed and before the third material film 10-3 and the fourth material film 10-4 are laminated. Moderate heating of the ITO in the heating chamber 31 makes it possible to appropriately control the crystal condition to provide an amorphous or crystalline ITO in an optimal condition.

In this usage mode, in a period after feeding from the first roll chamber W1 and before formation of the first material film 10-1 in the first film formation chamber 41, the substrate 10 can be subjected to a plasma treatment, using, for example, the plasma treatment devices 40, 41 provided between the heating chamber 31 and the first film formation chamber 41. Such a plasma treatment makes it possible to effective perform the subsequent film formation.

In this usage mode, in a period after feeding from the first roll chamber W1 and before formation of the first material film 10-1 in the first film formation chamber 41, the substrate 10 can be subjected to degassing using the heating chamber 31. Further, the substrate 10 can be degassed when it is being guided in the first direction A, using a heating function provided by the first rotary drum 51 of the first film formation chamber 41.

In this usage mode, in a period after formation of the first material film 10-1 on the first surface a and formation of the second material film 10-2 on the second surface b and before formation of the third material film 10-3 and the fourth material film 10-4, the substrate 10 can be subjected to an annealing treatment using the heating chamber 31. Further, the substrate 10 may be subjected to an annealing treatment, the substrate having the first material film 10-1 and the third or fourth material film 10-3 or 10-4 laminated in this order on the first surface, and having the second material film 10-2 and the fourth or third material film 10-3 or 10-4 laminated in this order on the second surface thereof.

In this usage mode, the substrate 10 may be subjected to an annealing treatment, the substrate having the first material film 10-1 and the second material film 10-2 formed on the first surface a or the first and second surfaces a and b thereof, using a heating chamber (not shown) provided between the second film formation chamber 42 and the second roll chamber W2. Description has been made based on a method of producing a laminate on both sides of the substrate 10. However, it is to be understood that the film formation treatment may be further repeated on both sides or one side of the substrate 10.

Figure 3:
FIG. 3 is a schematic diagram illustrating an example structure of a laminate obtained by another usage mode.

With reference to FIGS. 1 and 3, another usage mode of the present film formation method using a second feeding path, namely a feeding path defined by a switching roll 83 will now be described below. FIG. 2 illustrates an example structure of a laminate obtained by this another usage mode.

Firstly, the substrate 10 is unrolled and fed from the first roll chamber W1 in the first direction A using one surface a (referred to as "first surface", for convenience) as a surface for film formation. The fed substrate 10 is degassed using a heating function of the heating chamber 31 or the first rotary drum 51 of the first film formation chamber 41. Subsequently, a second material film 10-2 is formed on the first surface a of the substrate 10 that has been degassed in the heating chamber 31 or is being degassed using the first rotary drum 51 of the first film formation chamber 41, using the second cathode electrode 62 of the second film formation camber 42, and then the substrate 10 is once rolled up in the second roll chamber W2.

The substrate 10 is then unrolled and fed from the second roll chamber W2 in the second direction B in a continuous state without changing the surface for film formation. Thereafter, a third material film 10-3 is formed on the first surface a of the fed substrate 10, using the first cathode electrode 61 of the first film formation camber 41. The substrate 10 is then rolled up in the first roll chamber W1.

The laminate obtained by the above process is shown in FIG. 3. This laminate comprises the second material film 10-2 and the third material film 10-3 formed in this order on the first surface a of the substrate 10. Thus, the substrate 10 can be fed back and forth between the first roll chamber and the second roll chamber using the apparatus 1 to easily produce a laminate comprising the second material film and the third material film laminated on the substrate in this order, in a roll-to-roll manner, by forming the second material film 10-2 on the first surface a when the substrate is being guided in the first direction A and forming the third material film 10-3 on the second material film 10-2 when the substrate is being guided in the second direction B. The second material film 10-2 may be made of a transparent conducting layer, such as an amorphous or crystalline ITO, and the third material film 10-3 may be made of a metal, such as copper (Cu), copper alloy, silver (Ag) or silver alloy (e.g., APC alloy). However, these materials are not particularly limited.

With Reference to FIG. 4, an arrangement of a cathode electrode achievable by the usage mode of FIG. 3 will now be described below. FIG. 4(a) is a schematic plan view illustrating respective arrangements of the first cathode electrode 61 of the first film formation chamber 41 and the second cathode electrode 62 of the second film formation chamber 42, to be achieved when a film is formed on the substrate 10 being fed in the first direction A, and FIG. 4(b) is a schematic plan view illustrating respective arrangements of the first cathode electrode 61 of the first film formation chamber 41 and the second cathode electrode 62 of the second film formation chamber 42, to be achieved when a film is formed on the second substrate being fed in the second direction B.

Obviously, when the second material film 10-2 is formed in the second film formation chamber 42, all that is necessary for the first film formation chamber 41 is that the first rotary drum 51 of the first film formation chamber 41 can perform heating (degassing), but it is not necessary to perform film formation using the first cathode electrode 61. Thus, the degassing or the like in the first film formation chamber 41 may be performed in a state where the first cathode electrode 61 is removed from the first film formation chamber 41, for example, by moving an electrode body 60 supporting the first cathode electrode 61, as illustrated in FIG. 4(a). As a result, the first cathode electrode 61 removed from the first film formation chamber 41 can be subjected to maintenance such as replacement, and the film formation in the second film formation chamber 42 can be continuously performed even during the maintenance, so that it becomes possible to increase production efficiency of the substrate 10. An opening of the first film formation chamber 41 for allowing the first cathode electrode 61 to be removed from the first film formation chamber 41 therethrough may be closed by a temporary cover or the like, if necessary.

Similarly, when the third material film 10-3 is formed in the first film formation chamber 41, all that is necessary for the second film formation chamber 42 is that the second rotary drum 52 of the second film formation chamber 42 can perform heating (degassing), but it is not necessary to perform film formation using the second cathode electrode 62. Thus, the degassing or the like in the second film formation chamber 42 may be performed in a state where the second cathode electrode 62 is removed from the second film formation chamber 42, as illustrated in FIG. 4(b). As a result, the second cathode electrode 62 removed from the second film formation chamber 42 can be subjected to maintenance such as replacement, and the film formation in the first film formation chamber 41 can be continuously performed even during the maintenance, so that it becomes possible to obtain the same effect as described above. An opening of the second film formation chamber 42 for allowing the second cathode electrode 62 to be removed from the second film formation chamber 42 therethrough may be closed by a temporary cover or the like, in the same manner as described above, if necessary.

In this usage mode, in a period after feeding from the first roll chamber W1 and before formation of the second material film 10-2 in the second film formation chamber 42, the substrate can be subjected to a plasma treatment, using, for example, the plasma treatment devices 40, 40' provided between the heating chamber 31 and the first film formation chamber 41, and/or a plasma treatment device (not shown) provided between the first film formation chamber 41 and the third roll chamber W3, or between the third roll chamber W3 and the second film formation chamber 42. Further, in a period after feeding from the second roll chamber W2 and before formation of the first material film 10-1 in the first film formation chamber 41, the substrate can be subjected to a plasma treatment, using, for example, a plasma treatment device (not shown) provided between the second film formation chamber 42 and the second roll chamber W2, or a plasma treatment device (not shown) provided between the first film formation chamber 41 and the third roll chamber W3.

In this usage mode, in a period after feeding from the first roll chamber W1 and before degassing by the heating function (51) of the first film formation chamber 41, the substrate can be degassed, using, for example, the heating chamber 31 provided between the first roll chamber W1 and the first film formation chamber 41. Further, in a period after feeding from the second roll chamber W2 and before degassing by the heating function (52) of the second film formation chamber 42, the substrate can be degassed, using, for example, a heating chamber (not shown) provided between the second film formation chamber 42 and the second roll chamber W2.

In this usage mode, in a period after formation of the first material film 10-1 and before rolled up in the first roll chamber W1, the substrate can be subjected to an annealing treatment, using, for example, the heating chamber 31. Further, in a period after formation of the second material film 10-2 and before rolled up in the second roll chamber W2, the substrate can be subjected to an annealing treatment, using, for example, a heating chamber (not shown) provided between the second film formation chamber 42 and the second roll chamber W2.

The above description has been made based on an example where two film formation chambers are provided. However, it is to be understood that a film formation apparatus comprising three or more film formation chambers can obtain the same effects.

of the first and second film formation apparatuses, a heating chamber or a plasma treatment device may be appropriately provided at an adequate position, and the film formation method of the present invention may be implemented in a film formation apparatus incorporating it.

The present invention includes these various changes and modifications encompassed within a technical scope thereof.

INDUSTRIAL APPLICABILITY

The method according to the present invention may widely be used for various types of film formation apparatus.

EXPLANATION OF CODES

1: film formation apparatus
2: film formation apparatus
10: substrate
29: guide roll
31: heating chamber
40: plasma treatment device
41: first film formation chamber
42: second film formation chamber
51: first rotary drum
52: second rotary drum
83: switching roll
W1: first roll chamber
W2: second roll chamber
W3: third roll chamber

What is claimed is:

1. A method for continuously subjecting an elongated substrate to vacuum film formation, comprising the steps of:
   a) unrolling and feeding an elongated substrate wound in a roll form from a first roll chamber in a first direction from the first roll chamber toward a second roll chamber;
   b) degassing the substrate fed in the first direction;
   c) forming, in a first film formation chamber, a first material film on the first surface of the degassed substrate, wherein a second surface of the substrate, opposite the first surface, is free of material layers in the second roll chamber;
   d) guiding the substrate having the first material film formed thereon to a second film formation chamber in a second direction from the second roll chamber toward the first roll chamber, and forming, in the second film formation chamber, a second material film on the second surface when the substrate is being guided in the second direction;
   e) taking up, in a third roll chamber provided between the first roll chamber and the second roll chamber, the substrate in a roll form, the substrate having the first material film formed on the first surface and the second material film formed on the second surface;
   f) unrolling and feeding the substrate taken up in the third roll chamber from the first roll chamber in the first direction;
   g) guiding the fed substrate to the first film formation chamber in the first direction, and forming, in the first film formation chamber, a third material film on the first or the second surface of the substrate when it is being guided in the first direction;
   h) guiding the substrate having the third material film formed thereon to the second film formation chamber in the second direction, and forming, in the second film formation chamber, a fourth material film on the second or the first surface of the substrate when it is being guided in the second direction; and
   i) taking up, in the third roll chamber, the substrate in a roll form, the substrate having the third or fourth material film laminated on the first material film on the first surface and the fourth or third material film laminated on the second material film on the second surface.

2. The method as defined in claim 1, further comprising a step of subjecting the substrate to an annealing treatment, the substrate having the first material film formed on the first surface and the second material film formed on the second surface.

3. The method as defined in claim 1, wherein after taking up the substrate in the third roll chamber, the substrate having the first material film formed on the first surface and the second material film formed on the second surface, the substrate is removed in the third chamber in a state where a part of the substrate is communicated with a load lock mechanism provided between the third roll chamber and an adjacent chamber to the third roll chamber while shielding between the third roll chamber and the adjacent chamber using the load lock mechanism.

4. The method as defined in claim 1, wherein when unrolling and feeding the substrate taken up in the third roll chamber from the first roll chamber in the first direction, the substrate is set in the first roll chamber in a state where a part of the substrate is communicated with a load lock mechanism provided between the first roll chamber and an adjacent chamber to the first roll chamber while shielding between the first roll chamber and the adjacent chamber using the load lock mechanism.

5. The method as defined in claim 1 comprising, instead of the steps c) to e), the steps of:
   c') guiding the degassed substrate to a second film formation chamber in the first direction, and forming, in the second film formation chamber, a second material film on the first surface of the substrate when it is being guided in the first direction;
   d') taking up, in the second roll chamber, the substrate in a roll form, the substrate having the second material film formed thereon;
   e') unrolling and feeding the substrate taken up in the second roll chamber from the second roll chamber in a second direction from the second roll chamber toward the first roll chamber;
   f') forming, in a third film formation chamber, a first material film on the second material film formed on the first surface of the substrate fed in the second direction;
   g') taking up, in the first roll chamber, the substrate in a roll form, the substrate having the third material film laminated on the second material film; and
   h') transferring the substrate from the first roll chamber to the third roll chamber.

6. The method as defined in claim 5, wherein when forming, in the second film formation chamber, the second material film on the first surface of the substrate fed in the first direction, a first cathode electrode of the first film formation chamber supporting a target of the first material film is removed from the first film formation chamber.

7. The method as defined in claim 5, wherein when forming, in the first film formation chamber, the third material film on the first surface of the substrate fed in the second direction, a second cathode electrode of the second film formation chamber supporting a target of the second material film is removed from the second film formation chamber.

8. The method as defined in claim 1, wherein the substrate is subjected to a plasma treatment in a period after it is fed from the first roll chamber and before the first material film is formed thereon.

9. The method as defined in claim 1, wherein the substrate is degassed in a heating chamber in a period after it is fed from the first roll chamber and before the first material film is formed thereon.

10. The method as defined in claim 1, wherein the substrate is degassed when it is being guided in the first direction, in a period after the substrate is fed from the first roll chamber and before the first material film is formed thereon.

11. The method as defined in claim 1, wherein the substrate is subjected to an annealing treatment in a period after the first material film is formed on the first surface and the second material film is formed on the second surface of thereof and before the third material film and the fourth material film are formed thereon.

12. The method as defined in claim 1, wherein the substrate is subjected to an annealing treatment, the substrate having the first material film and the third or fourth material film laminated in this order on the first surface, and having the second material film and the fourth or third material film laminated in this order on the second surface thereof.

13. The method as defined in claim 1, wherein both of the first and the second materials are a transparent conducting layer.

14. The method as defined in claim 1, wherein both of the third and the fourth materials are a metal.

* * * * *